United States Patent
Grunwald

(10) Patent No.: US 6,805,911 B2
(45) Date of Patent: Oct. 19, 2004

(54) METHOD AND APPARATUS FOR IMPROVING INTERFACIAL CHEMICAL REACTIONS

(75) Inventor: John Grunwald, Ramat-Gan (IL)

(73) Assignee: J.G. Systems, Inc., Miami, FL (US)

( * ) Notice: Subject to any disclaimer, the term of this patent is extended or adjusted under 35 U.S.C. 154(b) by 0 days.

(21) Appl. No.: 10/425,365

(22) Filed: Apr. 29, 2003

(65) Prior Publication Data

US 2003/0207034 A1 Nov. 6, 2003

Related U.S. Application Data

(63) Continuation-in-part of application No. 10/230,269, filed on Aug. 29, 2002, now Pat. No. 6,599,563.

(51) Int. Cl.⁷ .................................................. B05D 3/02
(52) U.S. Cl. ........................ 427/314; 427/553; 427/557; 427/304; 427/316
(58) Field of Search .......................... 427/98, 304, 305, 427/306, 314, 316, 318, 319, 430.1, 437, 438, 443.1, 553, 557

(56) References Cited

U.S. PATENT DOCUMENTS

| | | | | |
|---|---|---|---|---|
| 3,679,949 A | * | 7/1972 | Uekusa et al. | ............... 257/449 |
| 3,882,695 A | * | 5/1975 | Flicker | .......................... 66/115 |
| 4,374,876 A | * | 2/1983 | El-Shazly et al. | ....... 427/443.1 |
| 4,610,934 A | * | 9/1986 | Boecker et al. | ............. 428/627 |
| 4,896,788 A | * | 1/1990 | Bolte et al. | ............... 220/359.2 |
| 6,599,563 B2 | * | 7/2003 | Grunwald | ..................... 427/98 |

* cited by examiner

Primary Examiner—Michael Barr
(74) Attorney, Agent, or Firm—Carmody & Torrance LLP

(57) ABSTRACT

The present invention provides a method for improving interfacial chemical reactions of a solid workpiece contacted with a liquid solution, said method comprising pre-heating the workpiece prior to immersion thereof in said liquid solution. The pre-heating may be carried out up to a temperature that is practicable without impairing the workpiece.

4 Claims, No Drawings

METHOD AND APPARATUS FOR IMPROVING INTERFACIAL CHEMICAL REACTIONS

This application is a continuation-in-part of application Ser. No. 10/230,269 filed Aug. 29, 2002, now U.S. Pat. No. 6,599,563.

FIELD OF THE INVENTION

BACKGROUND OF THE INVENTION

The above referenced pending application discloses ways to improve interfacial chemical reactions by preheating the workpiece, prior to its entry in a given processing solution, to a temperature higher than, or equal to, the temperature required for a given interfacial reaction to take place.

While above pending application envisions a broad scope of improving interfacial chemical reactions in general, it mainly focuses on, and exemplifies electroless plating of copper, especially as it relates to the manufacture of through-hole plated PCBs.

Also, above pending application, by virtue of principally being described in terms of electrolessly plating PCB laminates constructed from organic polymer composites, is dealing with preheating temperatures generally below or around 100 deg. C, mainly because of potential thermal degradation of polymers used in construction of PCB composites.

Thus, the above referenced pending application does not fully live up to its potential of specifically embodying more elevated preheating temperatures, i.e. approaching or exceeding temperatures of 100 deg. C and above. Such elevated temperatures are indeed practicable with heat-resistant workpieces, such as metals, refractory materials, and the like.

Interfacial technology is a very broad field, covering a vast and varied range of industries such as cleaning, stripping, electrophoretic painting, blackening of metals, metal plating powders such as diamonds, to name only a few. Thus, the Electrochemical Society issues a publication called "Interface", almost exclusively devoted to interfacial applications. While above publication is referenced mainly as a means of illustrating the technology of interfaces, it is also indicative of the prior art.

SUMMARY OF THE INVENTION

The objective of this invention is to improve, facilitate, speed up, interfacial chemical reactions, by preheating the workpiece to temperatures preferably at about or above 70 deg. C, more preferably at about or above 100 deg. C, prior to its entering a given processing solution. Conceptually, one will be guided by optimal temperatures that a given interfacial reaction demands, such temperatures being determined by what is needed by the desired interfacial reaction, without however exceeding maximum temperature tolerable for a given substrate material.

The method of the present invention may be applied to both metallic and non-metallic substrates.

Hence, this present application continues and complements above pending US application #2002/0086102A1, by pointing out and exemplifying heating temperatures as convenient/needed to optimize a given interfacial reaction, such temperature being limited only by what the substrate can bear without degradation or impairment In a preferred embodiment of the invention, the preheating of the workpiece to an optimal temperature, coupled with suitably designed accommodating composition and solution temperature, will lead to Ultra Fast Interfacial Reactions (UFIR), with significant potential for improved surface reactions.

It is noted that while the above-referenced pending application uses the term "pre-heating the workpiece" prior to being contacted with a given processing solution, it does not exclude preheating the workpiece, and also keeping it heated or "hot" for the duration of the interfacial reaction., if continued heating of the workpiece is beneficial in instances as they may arise.

Thus, in this application, which is a continuation of the one that is pending and referred to previously, pre-heating and heating are interchangeable and within the scope of pending application. The invention is principally directed to reactions that involve contacting solids with liquids (S/L), and is not directed to other interfacial reactions, for example solid/gas and liquid/gas.

Further, a preferred embodiment of the invention primarily envisions interfacial reactions involving solids contacted with liquids comprising aqueous solutions, emulsions, microemulsions and the like, without however excluding organic, non-aqueous solutions.

Again, the application envisages interfacial reactions generally involving solid workpieces regardless of their shape and material of construction, with the latter comprising metals, refractory materials or composites thereof, non-conductors or semiconductors as in silicon-bearing electronic devices in general and wafers in particular, powders made of metals, non-metals or combinations, fibers as in optical fibers, synthetic textiles, and the like.

Regarding the optimal preheating temperature, it will be best obtained by trial-and-error, being generally guided by the nature of the workpiece or substrate, the characteristics of the interfacial reaction, its kinetics, etc., again without such heating temperatures exceeding the highest that is allowable for a given material that the workpiece is made of.

The invention will benefit most, if not all type of interfacial reactions, and is not limited to electroless plating, surface finishing, and the like, though it may be principally exemplified via the latter, for the sake of convenience.

As to the method of preheating/heating the workpiece prior to its entry in a given processing solution, it will generally be selected on the basis of the raw material it is made of, its shape, thermal conductivity, the nature of the interfacial reaction, etc. While some potential methods of heating the workpiece are partially outlined in the pending application referenced previously, additional methods are of course at the disposal of one skilled in the art, namely radiation-induced heating such as IR, induction, microwave, etc. that in many processes may well be the method of choice.

Thus, the invention may especially benefit the processing of interconnect devices, LCD's, silicon wafers, optical fibers, integrated circuits, CMP planarization, to name some typical ones that are currently in the forefront of technological endeavors.

The advantages of the invention reside primarily, though not exclusively, in affording lower operating temperatures of processing solutions conducive to longer solution life, savings in energy, use of solution compositions comprising chemical compounds that are environmentally objectionable at elevated solution temperatures, etc. Additionally, the invention envisions reactions promoted/aided by "hot" solid/"cold" solution interface, where such reactions may not be easily obtained with unheated, i.e. "cold" solid/ solution interfaces of the prior art. While generally dealing with lower than recommended solution or bath temperature, the application does not exclude preheating the workpiece concurrently with heating the solution temperature as well, if the latter leads to further benefits, i.e. when interfacial reaction speed is of essence.

In addition to advantages/benefits that have been pointed out, potentially further ones, perhaps unforeseen, will emerge as the patent becomes available to, and is practiced by those skilled in the art.

The invention and its potential will now be partially illustrated in the ensuing examples.

EXAMPLE 1

A copper workpiece was heated to approximately 160 deg. C, then immersed in a bath of Metex (*) Tin Immersion, at ambient temperature for about 5 min. Following rinsing with water, the copper workpiece was observed to be coated with a film of tin metal.

Notes:
1. The asterisk (*) denotes a product/process offered in Israel by MacDermid Israel Ltd.
2. The recommended operating temperature of solutions of Metex (*) Tin Immersion is above 70 deg. C.
3. Workpiece, sample, substrate are used interchangeably

EXAMPLE 2

Same as EXAMPLE 1, except that the workpiece was not pre-heated Inspecting the workpiece, no visible tin metal film was observed.

EXAMPLE 3

A pyrex glass plate was immersed with agitation in a 1.5% v/vo Mactivate 10*, a tin/palladium activating solution, for about 10 min. at ambient temperature, water-rinsed, dried, and placed on a hot plate at about 160 deg. C, for 5 min. After dispensing about 100 cc. of a working solution of Metex *, electroless nickel 8030 heated to about 40 deg. C on the pyrex glass plate in contact with the hot plate at 160 deg. C, a copious, lustrous layer of electroless nickel was obtained only after 2 min.

It should be noted that the supplier's recommended operating temperature is 80–90 deg C.

EXAMPLE 4

Same as Example 3, except that this time 20 cc. of Metex (*) 8030 at 35–30 deg. C. was dispensed. After 1 min. a nickel film of about 0.5 micron was obtained.

EXAMPLE 5

Same as Example 4, except that the pyrex glass plate was at ambient temperature. No nickel film was observed.

EXAMPLE 6

A copper workpiece was heated to about 200 deg. C., and immersed in Metex* Macublack composition comprising sodium chlorite and caustic, designed to blacken copper for improved adhesion in multilayer PCB operations. After less than 5 min. in Metex (*) Macublack heated to about 60 deg C., the copper workpiece emerged black.

It is noted that supplier's recommended operating temperature is about 90 deg. C.

EXAMPLE 7

Same as EXAMPLE 3 except that this time it was Macudep (*) 9072/9073 electroless copper solution at ambient temp., that was dispensed onto the pyrex glass plate situated on top of the hot plate at 160 deg. C. A copious, lustrous copper deposit was formed after less than 5 sec.

It is noted that Examples 4 and 7 suggest embodiments of UFIR that are of great value, where processing times need to be reduced, production yields enhanced, etc. Some such embodiments may involve filling vias and microvias with metal, "additively" produced through hole PCBs, and the like, where prior art processing times are prohibitively long.

What is claimed is:

1. A method for improving interfacial chemical reactions, said method comprising:
   a) pre-heating a workpiece, comprised of a substrate material, to a pre-heat temperature of about 100° C. or higher; and thereafter
   b) contacting said pre-heated workpiece at a pre-heat temperature of about 100° C. or higher with a liquid; wherein an interfacial chemical reaction occurs upon contacting said pre-heated workpiece with said liquid and the speed with which said interfacial chemical reaction occurs is faster than the speed wish which the reaction would occur without said pre-heating.

2. A method for improving interfacial chemical reactions, said method comprising:
   a) pre-hearing a workpiece, comprised of a substrate material, to a pre-heat temperature of about 70° C. or higher; and thereafter
   b) contacting said pre-heated workpiece at a pre-heat temperature of about 70° C. or higher with a liquid; wherein an interfacial chemical reaction occurs upon contacting said pre-heated workpiece with said liquid and the speed with which said interfacial chemical reaction occurs is faster than the speed with which the reaction would occur without said pre-heating and wherein the substrate material comprises a non-metal material.

3. A method for improving interfacial chemical reactions, said method comprising:
   a) pre-heating a workpiece, comprised of a substrate material, to a pre-heat temperature of about 70° C. or higher; and thereafter
   b) contacting said pre-heated workpiece at a pre-heat temperature of about 70° C. or higher with a liquid; wherein an interfacial chemical reaction occurs upon contacting said pre-heated workpiece with said liquid and the speed with which said interfacial chemical reaction occurs is faster than the speed with which the reactions would occur without said pre-heating and wherein the substrate material comprises silicon.

4. A method for improving interfacial chemical reactions, said method comprising:
   a) pre-heating a workpiece, comprised of a substrate material, to a pre-heat temperature of about 70° C. or higher; and thereafter
   b) contacting said pre-heated workpiece at a pre-heat temperature or about 70° C. or higher with a liquid; wherein an interfacial chemical reaction occurs upon contacting said pre-heated workpiece with said liquid and the speed with which said interfacial chemical reaction occurs is faster than the speed with which the reaction would occur without said pre-heating and wherein the pre-healing is accomplished using a process selected from the group consisting of infrared heating, induction beating, and microwave heating.

* * * * *

UNITED STATES PATENT AND TRADEMARK OFFICE
CERTIFICATE OF CORRECTION

PATENT NO.    : 6,805,911 B2
DATED         : October 19, 2004
INVENTOR(S)   : John Grunwald It is certified that error appears in the above-identified patent and that said Letters Patent is hereby corrected as shown below:

<u>Column 4,</u>
Line 25, after "a)" delete the word "pre-hearing" and replace it with -- preheating --
Line 55, between "temperature" and "about" delete the word "or" and replace it with -- of --
Line 60, between "wherein the" and "is accomplished" delete the word "pre-healing" and replace it with -- pre-heating --
Line 62, between "induction" and "and microwave" delete the word "beating," and replace it with -- heating, --

Signed and Sealed this

First Day of February, 2005

JON W. DUDAS
*Director of the United States Patent and Trademark Office*